(12) United States Patent
Chen et al.

(10) Patent No.: US 6,263,957 B1
(45) Date of Patent: Jul. 24, 2001

(54) INTEGRATED ACTIVE COOLING DEVICE FOR BOARD MOUNTED ELECTRIC COMPONENTS

(75) Inventors: Shiaw-Jong S. Chen, Plano; Roger J. Hooey, Rockwall; Robert E. Radke, Garland, all of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/482,839

(22) Filed: Jan. 13, 2000

(51) Int. Cl.$^7$ ........................................................ F28F 7/00
(52) U.S. Cl. .......................... 165/80.4; 165/104.33; 361/699; 257/714; 174/15.1; 174/16.3
(58) Field of Search .................. 165/80.4, 80.3, 165/104.33, 185; 361/687, 688, 695, 699, 701, 677, 689, 698; 257/714; 174/15.1, 16.3

(56) References Cited

U.S. PATENT DOCUMENTS

| | | | |
|---|---|---|---|
| 3,817,321 | * | 6/1974 | Von Cube et al. ............. 165/104.33 |
| 4,109,707 | * | 8/1978 | Wilson et al. ........................ 361/385 |
| 5,144,531 | * | 9/1992 | Go et al. .............................. 165/80.4 |
| 5,285,347 | * | 2/1994 | Fox et al. ............................. 361/385 |
| 5,316,077 | * | 5/1994 | Reichard ........................... 165/104.33 |
| 5,729,995 | * | 3/1998 | Tajima .................................. 361/698 |
| 5,731,954 | * | 3/1998 | Cheon .................................. 361/699 |
| 5,818,692 | * | 10/1998 | Denney, Jr. et al. ................ 165/80.3 |
| 5,835,350 | | 11/1998 | Stevens ................................ 361/704 |
| 5,901,037 | * | 5/1999 | Hamilton et al. ............... 165/104.33 |
| 5,953,211 | * | 9/1999 | Donahoe et al. ..................... 361/704 |
| 5,998,863 | * | 12/1999 | Kobayashi et al. .................. 257/714 |
| 6,005,772 | * | 12/1999 | Terao et al. .......................... 361/699 |
| 6,019,165 | * | 2/2000 | Batchelder .......................... 165/80.3 |
| 6,029,742 | * | 2/2000 | Burward-Hoy ...................... 165/80.4 |
| 6,166,907 | * | 12/2000 | Chien ................................... 361/699 |

* cited by examiner

Primary Examiner—Marvin M. Lateef
Assistant Examiner—Terrell McKinnon

(57) ABSTRACT

An integrated cooling device for use in cooling an electronic component or an integrated circuit and a method of manufacturing the same. In one embodiment, the device includes: (1) a plate couplable to and supportable by the electronic component, the plate having at least one channel therein, (2) a closed-circuit circulation pipe having a heat-receiving portion disposed in the at least one channel to place the heat-receiving portion in thermal communication with the plate, the circulation pipe further having a heat-removing portion distal from the heat receiving portion, (3) a coolant located within the circulation pipe and (4) a pump coupled to the circulation pipe, supported by the plate and operable to cause the coolant to circulate through the circulation pipe.

24 Claims, 4 Drawing Sheets

INTEGRATED ACTIVE COOLING DEVICE FOR BOARD MOUNTED ELECTRIC COMPONENTS

TECHNICAL FIELD OF THE INVENTION

The present invention is directed, in general, to a cooling device for electronic components and, more specifically, to an integrated active cooling device employable with board mounted electronic components.

BACKGROUND OF THE INVENTION

Designers of electronic circuits must incorporate into their designs methods to control heat generated by electronic components in the circuit. Unless controlled, the heat build-up will cause component and circuit failure. Temperature control, therefore, is vital to circuit reliability. The preferred method to controlling temperature is to dissipate the excess heat into the ambient air surrounding the electronic circuit before temperatures rise to a level where damage can occur.

The traditional method to contain temperature build-up is to associate heat generating components with heat dissipation devices, such as heat sinks. The heat dissipation device absorbs heat from the component and provides for a more efficient transfer of excess heat into the surrounding ambient air. In most cases, the heat generating component will be mounted directly to the heat dissipation device to more efficiently remove the excess heat.

Although traditional heat sinking methods can be used successfully in most cases, the problems associated with temperature control have become more pronounced as electronic circuits have become more complex. Such circuit complexity often results in a circuit that requires a larger number of components, which frequently are more powerful and can generate even more heat. The problem is further complicated by the fact that lower profile and more compact electronic systems have become the preferred choice of customers. This means that space must be found in such low profile, compact systems for both the electronic components that make up the circuit as well as the heat dissipation devices that such components require in order to prevent heat related damage. In short, as the power density of circuits has increased, the use of classic finned heat sinks may no longer adequately address the corresponding heat dissipation requirements.

Some of the foregoing problems have been resolved by using active, rather than passive, systems to control temperature build up. For example, certain board mounted electronic components that generate large amounts of heat can have an active cooling device, such as a small fan, dedicated solely to the device. In those situations where a fan is used as the active device, the fan is mounted directly on the component and improves cooling by moving more ambient air over the component. Using a fan in this manner will provide more efficient cooling in less space than a classic finned heat sink.

Notwithstanding the benefits associated with using an active cooling device, such as a fan, with a heat generating electronic component, the increasing demands for more aggressive temperature control require new and improved heat control methods.

Accordingly, what is needed in the art is an active heat control device that can be used to efficiently control temperature build-up caused by heat generating electronic components in an electronic circuit.

SUMMARY OF THE INVENTION

To address the above-discussed deficiencies of the prior art, the present invention provides an integrated cooling device for use in cooling an electronic component or an integrated circuit and a method of manufacturing the same. In one embodiment, the device includes: (1) a plate couplable to and supportable by the electronic component, the plate having at least one channel therein; (2) a closed-circuit circulation pipe having a heat-receiving portion disposed in the at least one channel to place the heat-receiving portion in thermal communication with the plate, the circulation pipe further having a heat-removing portion distal from the heat-receiving portion; (3) a coolant located within the circulation pipe; and (4) a pump coupled to the circulation pipe, supported by the plate and operable to cause the coolant to circulate through the circulation pipe.

In an alternative embodiment, wherein the device is used in cooling an integrated circuit, the device includes: (1) a plate having a footprint based on a footprint of the integrated circuit, the plate couplable to and supportable by the integrated circuit and having at least one channel therein; (2) a closed-circuit circulation pipe having a heat-receiving portion disposed in the at least one channel to place the heat-receiving portion in thermal communication with the plate, the circulation pipe further having a heat-removing portion distal from the heat-receiving portion and substantially within a footprint of the plate; (3) a coolant located within the circulation pipe; and (4) a pump coupled to the circulation pipe, supported by the plate and operable to cause the coolant to circulate through the circulation pipe.

The present invention, in broad scope, therefore introduces the broad concept of an active cooling device that can be used to cool a heat generating electronic component. The invention provides for a closed-circuit circulation system where, as the coolant is circulated through a circuit, heat is gathered from the electronics device while the coolant is in close proximity to the device and then, when the coolant is no longer in close proximity to the device, the heat is transferred to the surrounding ambient air.

In one embodiment of the present invention, the channel through the plate that is couplable to and supportable by the electronic component is circuitous. In one aspect of the invention the portion of the circulation pipe that is distal from the heat-receiving portion and constitutes the heat-removing portion is circuitous. In yet another embodiment of the present invention, the circulation pipe comprises copper. In still another embodiment, the coolant comprises a liquid, such as water.

In a particularly useful embodiment of the invention, the channel is located in a surface of the plate that is adjoinable to the electronic component. The system, in one embodiment of the invention, may also include a line cord that is coupled to the pump and couplable to the electronic component so that the pump may draw electric power from the electronic component to activate the pump.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
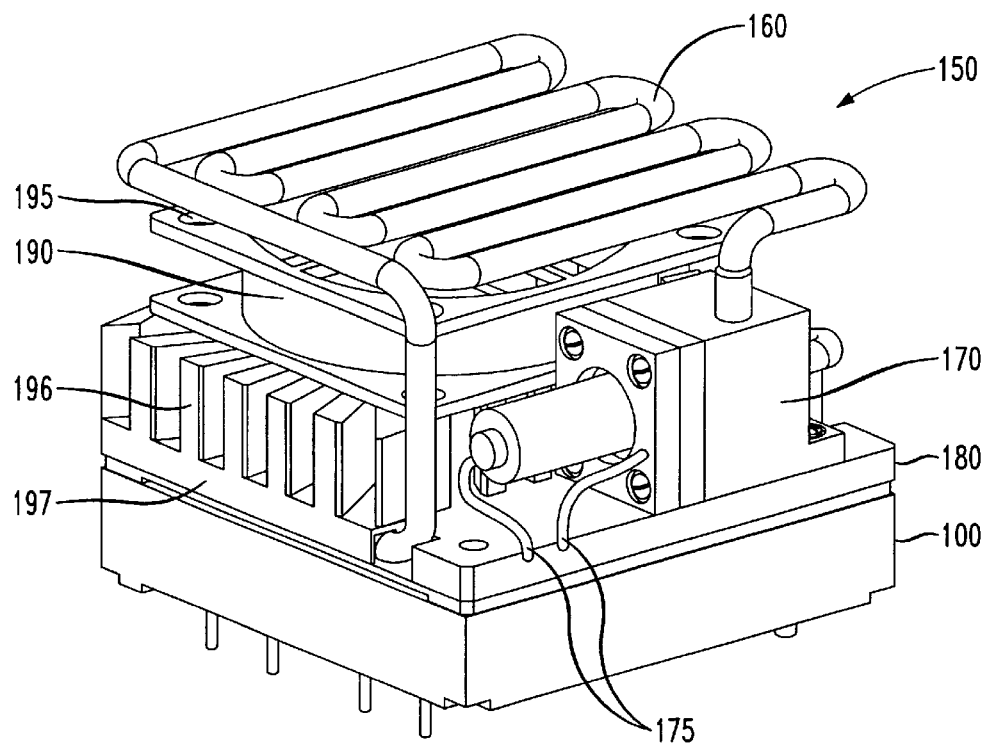
FIG. 1A illustrates an isometric view of an embodiment of a board mounted power supply constructed in accordance with the principles of the present invention.

Referring initially to FIG. 1A, illustrated is an isometric view of an embodiment of a board mounted power supply 100 constructed in accordance with the principles of the present invention. The board mounted power supply 100 has a top mounted integrated cooling device 150 mounted thereon. Those skilled in the pertinent art will understand that the invention described herein can be used to cool other heat generating electronic components besides the board mounted power supply 100 described and illustrated herein. Therefore, although the description and illustrations herein are directed to using a top mounted integrated cooling device 150 with a board mounted power supply 100, the use of the top mounted integrated cooling device 150 with other heat generating electronic devices and integrated circuits is well within the broad scope of the present invention.

A closed-circuit circulation pipe 160 on the integrated cooling device 150 contains a coolant (not visible), (e.g., a liquid coolant such as water or other suitable substance) that is circulated through the cooling device 150 to provide cooling for the power supply 100. A pump 170 on the cooling device 150 is supported by a plate 180 that is couplable to and supported by the board mounted power supply 100. The pump 170 circulates the coolant through the closed-circuit circulation pipe 160. The illustrated embodiment also has a fan assembly 190, with a fan 195 positioned on top of the fins 196 of a heat sink 197. Electric power is furnished to the pump 170 and the fan 195 by line cords 175 that may draw electric power from the board mounted power supply 100 or, in an alternatively embodiment, from an external power source.

Figure 1B:
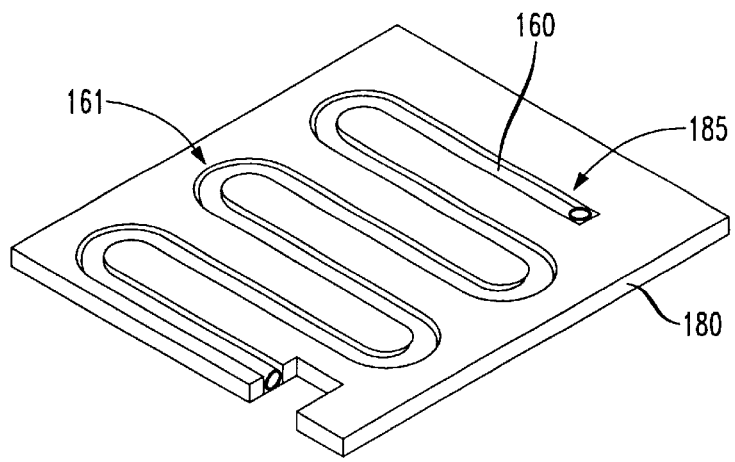
FIG. 1B illustrates an isometric view of the bottom side of the plate on the top mounted integrated cooling device of FIG. 1A.

Turning now to FIG. 1B, illustrated is an isometric view of the bottom side of the plate 180 of the top mounted integrated cooling device 150 of FIG. 1A. Running through the plate 180 is a channel 185 within which is disposed a portion of the closed-circuit circulation pipe 160. When coupled to and supported by the board mounted power supply 100, this portion of the circulation pipe 160 constitutes a heat-receiving portion 161.

Figure 2:
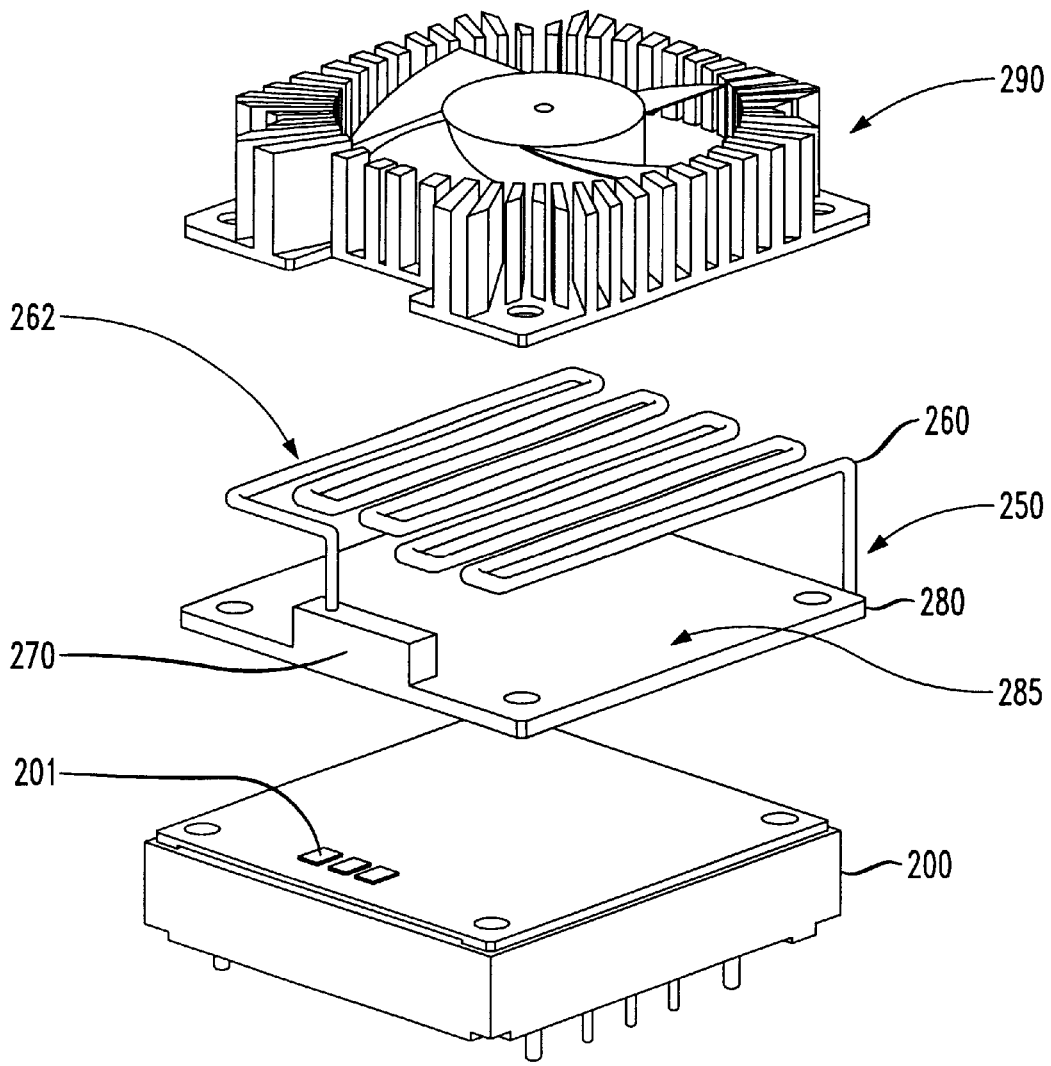
FIG. 2 illustrates an exploded isometric view of another embodiment of a board mounted power supply.

Turning now to FIG. 2, illustrated is exploded isometric view of another embodiment of a board mounted power supply 200. The board mounted power supply 200 has the top mounted integrated liquid cooling device 250 mounted thereon. The exploded view clearly illustrates the subassemblies, including the board mounted power supply 200, the integrated cooling device 250 and the fan assembly 290. This view illustrates, among other things, that the size of the foot print of the plate 280 on the integrated cooling device 250 is based on the foot print of the power supply 200 to which it is couplable. The close proximity of the plate 280 to the board mounted power supply 200 places the portion of the closed-circuit circulation pipe 260, disposed within a channel (not visible) of the plate 280, in thermal communication with the board mounted power supply 200. Coolant within a heat-receiving portion of the circulation pipe 260 can then absorb heat generated by the board mounted power supply 200. The pump 270 then pushes the heated coolant through the circulation pipe 260 until it moves into the portion of the circulation pipe 260 distal to the heat-receiving portion that constitutes a heat-removing portion 262. In the heat-removing portion 262 of the circulation pipe 260, heat absorbed by the coolant in the heat-receiving portion is dissipated into the surrounding ambient air. In the illustrated embodiment, the fan assembly 290 is used to accelerate the transfer of the heat into the surrounding ambient air by moving air across the heat-removing portion 262 of the closed-circuit circulation pipe 260.

Referring back to FIG. 1B, the illustrated channel 185 in the plate 180 is circuitous. In FIG. 2, the heat-removing portion 262 of the circulation pipe 260 is also circuitous. Both the embodiments of FIG. 1B and FIG. 2 are advantageous because the coolant, while in the heat-receiving portion of the circulation pipe, will be exposed for a longer period of time to a larger area of the board mounted power supply and can, therefore, absorb more heat. By the same token, the coolant will be exposed to cooling air for a longer period of time in the heat-removing portion of the circulation pipe and will be able to transfer more heat to the surrounding ambient air. Notwithstanding these depictions, an integrated cooling device having either, or both of, a non-circuitous channel in the plate or a non-circuitous heat-removing portion of the circulation pipe will be well within the broad scope of the present invention.

Referring again to FIG. 1A, in one embodiment of the invention, the pump 170 may be powered by external power provided by the line cord 175 that is coupled to the pump 170 and couplable to the board mounted power supply 100 or other external power sources. Turning now to FIG. 2, another embodiment of the invention is illustrated where electrical power is supplied to the pump 270 by a through-via electrical connector 201. The through-via electrical connector 201 is described in detail in U.S. patent application Ser. No. LUCT-120015, entitled A THROUGH VIA PLATE ELECTRICAL CONNECTOR AND METHOD OF MANUFACTURE THEREOF, to Chen, et. al., commonly assigned with the invention and incorporated herein by reference.

Figure 3:
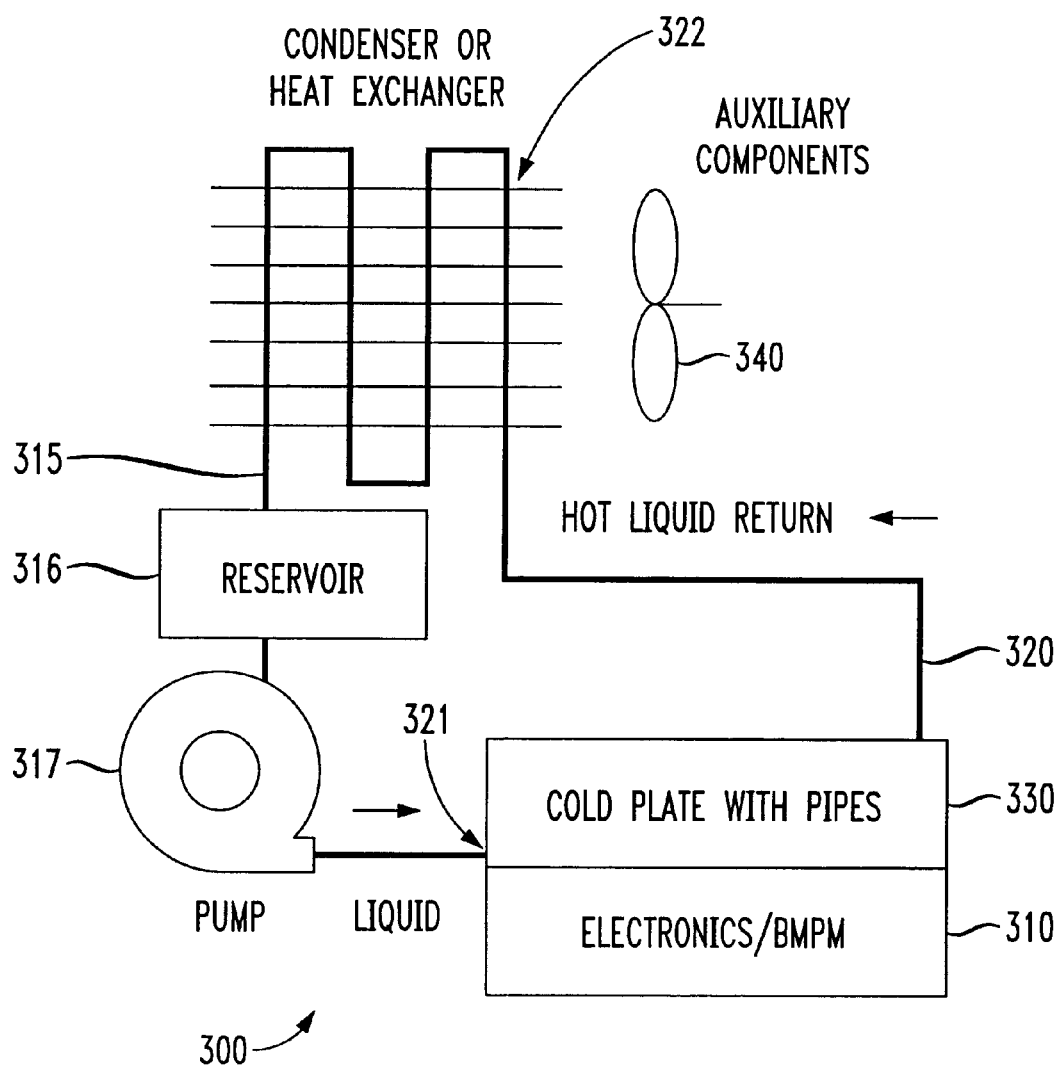
FIG. 3 illustrates a block diagram of an embodiment of an integrated cooling device 300 constructed in accordance with the principles of the present invention.

Turning now to FIG. 3, illustrated is a block diagram of an embodiment of an integrated cooling device 300 constructed in accordance with the principles of the present invention. The integrated cooling device 300 may be used to cool a heat generating electronic component 310 or a heat generating integrated circuit. A pump 317 is used to move a liquid coolant 315, such as water, from a reservoir 316 into a heat-receiving 321 portion of the closed-circuit circulation pipe 320. The coolant 315 is initially pumped through the heat-receiving portion 321 of the circulation pipe 320 that is located within a channel in the plate 330. The coolant 315 and the heat-receiving portion 321 of the circulation pipe 320 is in thermal communication with the plate 330.

As the liquid coolant 315 moves through the heat-receiving portion 321 of the circulation pipe 320, it absorbs heat generated by the electronic component 310 that has been conducted to the plate 330. When the coolant 315 moves into the heat-removing portion 322 of the circulation pipe 320, the heat absorbed by the coolant 315 is then transferred by radiation and convection or conduction into the surrounding ambient air. The transfer efficiency may be improved by employing a fan 340 to move ambient air over the heat-removing portion 322 of the circulation pipe 320. Of course, the fan 340 is not required by the principles of the present invention. The liquid coolant 315 is then returned to the reservoir 316 where it is stored until the pump 317 draws the liquid coolant 315 from the reservoir 316 to repeat the process. In one embodiment of the invention, the circulation pipe 320 is comprised of copper, although other suitable materials can be used for the circulation pipe 320 and still be within the intended scope of the present invention.

Figure 4:
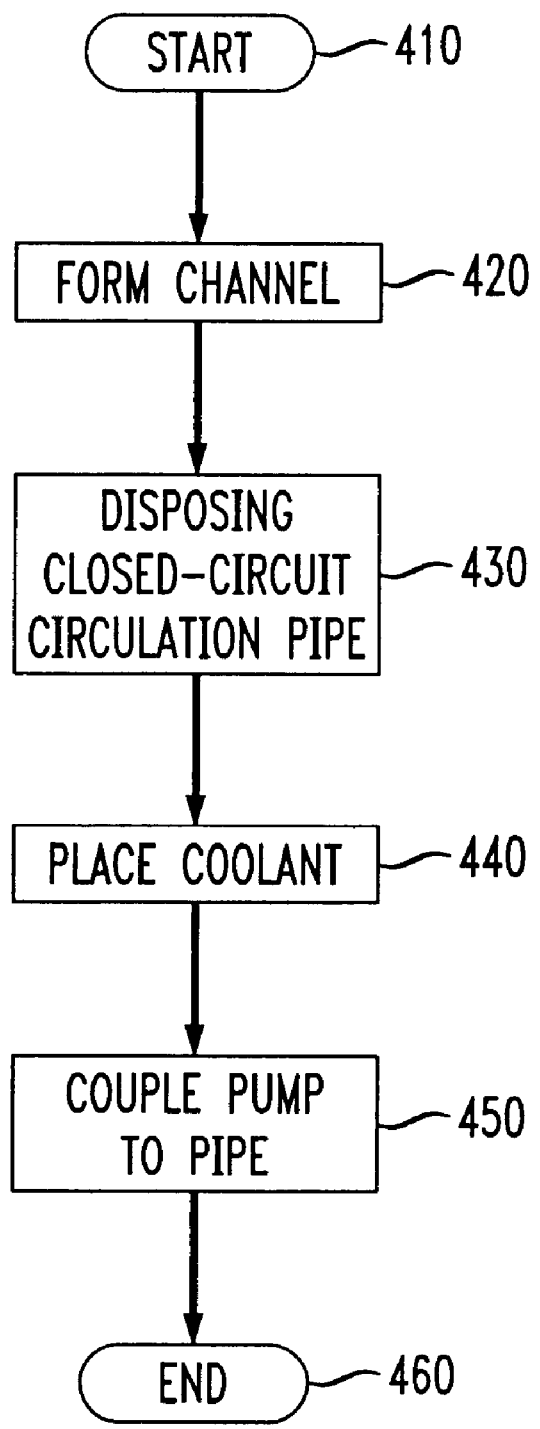
FIG. 4 illustrates an embodiment of a method to manufacture an integrated active cooling device for board mounted electronic components.

Turning now to FIG. 4, illustrated is an embodiment of a method 400 of manufacturing an integrated active liquid cooling device for board mounted electronic components. The method 400 commences with the start step 410. In a form channel step 420, at least one channel is formed in a plate that is couplable to and supportable by an electronic component, such as a board mounted power supply or an integrated circuit. In a disposing closed-circuit circulation pipe step 430, a circulation pipe, having a heat-receiving portion, is disposed in at least one channel of the plate that is in thermal communication with the plate. The circulation pipe also has a heat-removing portion distal to the heat receiving portion. In a place coolant step 440, a liquid coolant, such as water, is located within the circulation pipe. In a coupling pump to pipe step 450, a pump is coupled to the circulation pipe. The pump is supported by the plate and operable to cause the liquid coolant to circulate through the circulation pipe. The method of manufacture concludes with the end step 460.

Although the present invention has been described in detail, those skilled in the art should understand that they can make various changes, substitutions and alterations herein without departing from the spirit and scope of the invention in its broadest form.

What is claimed is:

1. For use in cooling an electronic component, an integrated cooling device, comprising:
   a plate couplable to and supportable by said electronic component, said plate having at least one channel therein;
   a closed-circuit circulation pipe having a heat-receiving portion disposed in said at least one channel to place said heat-receiving portion in thermal communication with said plate, said circulation pipe further having top-mounted heat-removing portion substantially within a footprint of said plate;
   a coolant located within said circulation pipe; and
   a pump coupled to said circulation pipe, supported by said plate and operable to cause said coolant to circulate through said circulation pipe.

2. The device as recited in claim 1 wherein said at least one channel is circuitous.

3. The device as recited in claim 1 wherein said heat-removing portion is circuitous.

4. The device as recited in claim 1 wherein said circulation pipe comprises copper.

5. The device as recited in claim 1 wherein said coolant comprises water.

6. The device as recited in claim 1 wherein said at least one channel is located in a surface of said plate that is adjoinable said electronic component.

7. The device as recited in claim 1 further comprising a line cord, coupled to said pump and couplable to said electronic component, that draws electric power from said electronic component to activate said pump.

8. The device as recited in claim 7 wherein said line cord draws electrical power from an external power source.

9. A method of manufacturing an integrated cooling device for use in cooling an electronic component, comprising:
   forming at least one channel in a plate couplable to and supportable by said electronic component;
   disposing a closed-circuit circulation pipe having a heat-receiving portion in said at least one channel to place said heat-receiving portion in thermal communication with said plate, said circulation pipe further having a top-mounted heat-removing portion substantially within a footprint of said plate;
   placing a coolant within said circulation pipe; and
   coupling a pump to said circulation pipe, said pump supported by said plate and operable to cause said coolant to circulate through said circulation pipe.

10. The method as recited in claim 9 wherein said at least one channel is circuitous.

11. The method as recited in claim 9 wherein said heat-removing portion is circuitous.

12. The method as recited in claim 9 wherein said circulation pipe comprises copper.

13. The method as recited in claim 9 wherein said coolant comprises water.

14. The method as recited in claim 9 wherein said forming comprises forming said at least one channel in a surface of said plate that is adjoinable said electronic component.

15. The method as recited in claim 9 further comprising coupling a line cord to said pump, said line cord couplable to said electronic component to draw electric power therefrom to activate said pump.

16. The method as recited in claim 15 further comprising coupling said line cord to draw electrical power from an external power source.

17. For use in cooling an integrated circuit, an integrated cooling device, comprising:
   a plate having a footprint based on a footprint of said integrated circuit, said plate couplable to and supportable by said integrated circuit and having at least one channel therein;
   a closed-circuit circulation pipe having a heat-receiving portion disposed in said at least one channel to place said heat-receiving portion in thermal communication with said plate, said circulation pipe further having a top-mounted heat-removing portion substantially within a footprint of said plate;
   a liquid coolant located within said circulation pipe; and
   a pump coupled to said circulation pipe, supported by said plate and operable to cause said liquid coolant to circulate through said circulation pipe.

18. The device as recited in claim 17 wherein said at least one channel is circuitous.

19. The device as recited in claim 17 wherein said heat-removing portion is circuitous.

20. The device as recited in claim 17 wherein said circulation pipe comprises copper.

21. The device as recited in claim 17 wherein said liquid coolant is water.

22. The device as recited in claim 17 wherein said at least one channel is located in a surface of said plate that is adjoinable said integrated circuit.

23. The device as recited in claim 17 further comprising a line cord, coupled to said pump and couplable to said integrated circuit, that draws electric power from said integrated circuit to activate said pump.

24. The device as recited in claim 23 wherein said line cord draws electrical power from an external power source.

* * * * *